United States Patent
Kim et al.

(10) Patent No.: US 12,374,415 B2
(45) Date of Patent: Jul. 29, 2025

(54) POWER SOURCE SWITCHING CIRCUIT FOR MEMORY DEVICE

(71) Applicant: Magnachip Mixed-Signal, Ltd., Cheongju-si (KR)

(72) Inventors: Hyoung Kyu Kim, Cheongju-si (KR); Il Jun Kim, Cheongju-si (KR); Kwon Young Oh, Cheongju-si (KR); Sang Ho Lee, Cheongju-si (KR)

(73) Assignee: Magnachip Mixed-Signal, Ltd., Cheongju-si (KR)

( * ) Notice: Subject to any disclaimer, the term of this patent is extended or adjusted under 35 U.S.C. 154(b) by 134 days.

(21) Appl. No.: 18/330,768

(22) Filed: Jun. 7, 2023

(65) Prior Publication Data
US 2024/0145019 A1 May 2, 2024

(30) Foreign Application Priority Data
Nov. 1, 2022 (KR) .................. 10-2022-0143836

(51) Int. Cl.
*G11C 16/12* (2006.01)
*G11C 17/18* (2006.01)
(52) U.S. Cl.
CPC .................. *G11C 17/18* (2013.01)
(58) Field of Classification Search
CPC ........... G11C 17/18; G11C 5/14; G11C 16/30; G11C 16/12; G11C 16/04; G11C 17/12; H03K 19/018521

USPC .......................................... 365/226
See application file for complete search history.

(56) References Cited

U.S. PATENT DOCUMENTS

| 7,826,297 | B2 | 11/2010 | Takeda et al. | |
|---|---|---|---|---|
| 2019/0259455 | A1* | 8/2019 | Kashihara | G11C 16/12 |
| 2020/0051652 | A1* | 2/2020 | Jeong | H03K 3/35613 |

* cited by examiner

*Primary Examiner* — Huan Hoang
(74) *Attorney, Agent, or Firm* — NSIP Law

(57) ABSTRACT

A power source switching circuit for a memory device includes: a first power source voltage terminal for supplying a first power source voltage, a second power source voltage terminal for supplying a second power source voltage, a first metal-oxide-semiconductor field-effect transistor (MOSFET) and a second MOSFET connected in series with the first power source voltage terminal, a first level shifter connected to the first MOSFET and supplied with the first power source voltage, a second level shifter connected to the second MOSFET and supplied with the second power source voltage, a third MOSFET connected to the second MOSFET, and a third level shifter connected to the third MOSFET and supplied with a third power source voltage, and a memory cell of a non-volatile memory is programmed using the first power source voltage or the second power source voltage.

19 Claims, 3 Drawing Sheets

POWER SOURCE SWITCHING CIRCUIT FOR MEMORY DEVICE

CROSS-REFERENCE TO RELATED APPLICATION

This application claims the benefit under 35 U.S.C. § 119(a) of Korean Patent Application No. 10-2022-0143836, filed on Nov. 1, 2022, in the Korean Intellectual Property Office, the entire disclosure of which is incorporated herein by reference for all purposes.

BACKGROUND

1. Field

The following description relates to a power source switching circuit for a memory device that switches a voltage required to program data in memory cells of non-volatile memory, such as One-Time Programmable (OTP) memory.

2. Description of Related Art

When programming data for memory cells of an OTP memory, a power source voltage at a predetermined level is required. Conventionally, as such power source voltage, only an external power source was used, and since only one power source voltage was used, a circuit was constructed by connecting the power source voltage to the OTP memory as it is. Therefore, there was no need to control the power source voltage.

On the other hand, there is a demand to program the OTP memory with an internal power source generated internally as much as possible, excluding using an external power source. Currently, using an internal power source does not mean that an external power source is never considered because one of the external and internal power sources may have to be selected. Therefore, a plurality of switches, such as MOSFETs, and a plurality of level shifters (LSs) for controlling the switches may be required in a circuit with two power source voltages.

Typically, a circuit that switches over a plurality of power supply voltages and a circuit configuration in which a plurality of level shifter circuits control PMOS and NMOS transistors may provide an output voltage stably without leakage current. However, only one power source voltage is applied to the level shifter circuits in this configuration. Thus, a level shifter voltage could be normally controlled only when an appropriate power source voltage was applied to the level shifter circuits, and the level shifter circuits could not be normally controlled when the appropriate power source voltage was not supplied.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power source switching circuit for a memory device includes a first power source voltage terminal and a second power source voltage terminal; a first metal-oxide-semiconductor field-effect transistor (MOSFET) and a second MOSFET connected in series with the first power source voltage terminal; a first level shifter connected to the first MOSFET and supplied with a first power source voltage; a second level shifter connected to the second MOSFET and supplied with a second power source voltage; a third MOSFET connected to the second MOSFET; a third level shifter connected to the third MOSFET and supplied with a third power source voltage; a fourth MOSFET and a fifth MOSFET connected in series with the second power source voltage terminal; a fourth level shifter connected to the fourth MOSFET and supplied with the second power source voltage; a fifth level shifter connected to the fifth MOSFET and supplied with the first power source voltage; a sixth MOSFET connected to the fifth MOSFET; and a sixth level shifter connected to the sixth MOSFET and supplied with the third power source voltage. A memory cell of a non-volatile memory connected to the second and fifth MOSFETs may be programmed using the first power source voltage or the second power source voltage.

When the first power source voltage is supplied as a programming voltage for the non-volatile memory, a gate terminal of the second MOSFET may become a ground voltage level by the third level shifter using the third power source voltage, and the first power source voltage may be output to the non-volatile memory through the first MOSFET and the second MOSFET in a turn-on state.

The second power source voltage terminal may be supplied with a ground voltage or a predetermined voltage or is in a floating state, and the fifth MOSFET may be turned off.

A first control signal applied to the first through third level shifters may be in a high level state, and a second control signal applied to the fourth through sixth level shifters may be in a low level state.

When the second power source voltage is supplied as a programming voltage for the non-volatile memory, a gate terminal of the fifth MOSFET may become a ground voltage level by the sixth level shifter using the third power source voltage, and the second power source voltage may be output to the non-volatile memory through the fourth MOSFET and the fifth MOSFET in a turn-on state.

The first power source voltage terminal may be supplied with a ground voltage or a predetermined voltage or is in a floating state, and the second MOSFET may be turned off.

A first control signal applied to the first through third level shifters may be in a low level state, and a second control signal applied to the fourth through sixth level shifters may be in a high level state.

The first, second, fourth, and fifth MOSFETs may be P-channel metal-oxide semiconductors (PMOSs), and the third and sixth MOSFETs may be N-channel metal-oxide semiconductors (NMOSs).

A drain terminal of the first MOSFET and a drain terminal of the second MOSFET may be connected to each other. A drain terminal of the fourth MOSFET and a drain terminal of the fifth MOSFET may be connected to each other.

A drain terminal of the third MOSFET may be connected to a gate terminal of the second MOSFET. A drain terminal of the sixth MOSFET may be connected to a gate terminal of the fifth MOSFET.

Body terminals of the first through sixth MOSFETs may be connected to their respective source terminals.

Voltage levels of the first through third power source voltages may be different from each other.

In another general aspect, a power source switching circuit for a memory device includes a first power source voltage terminal for supplying a first power source voltage; a second power source voltage terminal for supplying a second power source voltage; a first metal-oxide-semiconductor field-effect transistor (MOSFET) and a second MOSFET connected in series with the first power source voltage terminal; a first level shifter connected to the first MOSFET and supplied with the first power source voltage; a second level shifter connected to the second MOSFET and supplied with the second power source voltage; a third MOSFET connected to the second MOSFET; and a third level shifter connected to the third MOSFET and supplied with a third power source voltage. A memory cell of a non-volatile memory may be programmed using the first power source voltage or the second power source voltage.

When the first power source voltage is supplied as a programming voltage for the non-volatile memory, a gate terminal of the second MOSFET may become a ground voltage level by the third level shifter using the third power source voltage, and the first power source voltage may be output to the non-volatile memory through the first and second MOSFETs in a turn-on state.

The second power source voltage terminal may be in a floating state.

A first control signal applied to the first through third level shifters may be in a high level state.

When the second power source voltage is supplied as a programming voltage for the non-volatile memory, the first power source voltage terminal may be supplied with a ground voltage or a predetermined voltage or is in a floating state, and the second MOSFET may be turned off.

A first control signal applied to the first through third level shifters may be in a low level state.

The first MOSFET and the second MOSFET may be P-channel metal-oxide semiconductors (PMOSs), and the third MOSFET may be an N-channel metal-oxide semiconductor (NMOS).

A drain terminal of the first MOSFET and a drain terminal of the second MOSFET may be connected to each other. A drain terminal of the third MOSFET may be connected to a gate terminal of the second MOSFET.

Body terminals of the first through third MOSFETs may be connected to their respective source terminals.

Other features and aspects will be apparent from the following detailed description, the drawings, and the claims.

Figure 1:
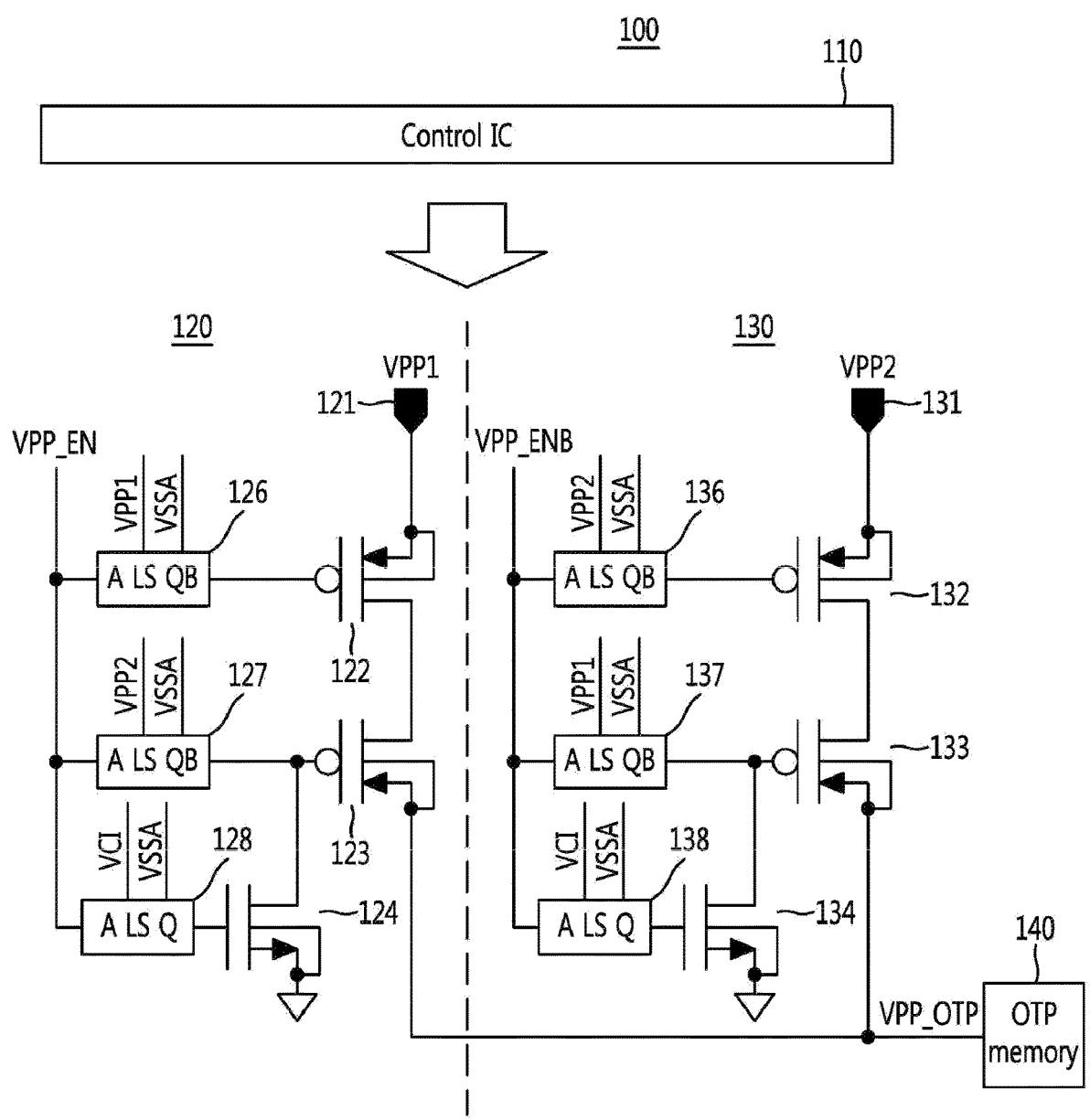
FIG. 1 illustrates an exemplary power source switching circuit in accordance with a first embodiment of one or more examples.

Throughout the drawings and the detailed description, unless otherwise described or provided, the same reference numerals may be understood to refer to the same or like elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

The terms indicating a part such as "part" or "portion" used in the present description mean that the component may represent a device that may include a particular function, a software that may include a particular function, or a combination of a device and software that may include a particular function, but it cannot be said to be limited to the functions expressed. This is provided only to help a more general understanding of the present description and those of ordinary skill in the art can make various modifications and variations from these descriptions.

In addition, all electrical signals used in the present description, as an example, should be noted that signs of all electrical signals to be described below may be reversed when an inverter, etc., is additionally provided in the circuit of the present description. Thus, the scope of the present description is not limited to the direction of the signal.

Hence, the spirit of the present description should not be limited to the described embodiments or examples. Not only the claims described later but all equivalent or equivalent modifications to these claims belong to the scope of the present description.

Hereinafter, the present disclosure is described in more detail based on the example illustrated in the drawings.

The present description is suggested to provide a power source switching circuit for a memory device that programs a memory cell of a non-volatile memory while stably controlling power sources of level shifters even if one of two power source voltages is not supplied.

FIG. 1 illustrates an exemplary power source switching circuit in accordance with a first embodiment of one or more examples.

According to FIG. 1, a power source switching circuit 100 includes a control IC 110, a first switching unit 120, a second switching unit 130, and a non-volatile memory (i.e., OTP memory) 140.

The control IC 110 may be a controller that controls the entire operation of a display driving device, including the power source switching circuit 100. For example, the control IC 110 may control processing a series of data and command signals based on information stored in the non-volatile memory 140 and transmitting and displaying an image to a display panel. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

In an example, the control IC 110 may control whether to supply a first power source voltage VPP1, a second power source voltage VPP2, and a rated voltage VCI, whether to apply a first control signal VPP_EN and a second control signal VPP_ENB, and so on.

The first switching unit 120 is supplied with a first power source voltage VPP1 through a first power source voltage terminal 121, and the second switching unit 130 is supplied with a second power source voltage VPP2 through a second power source voltage terminal 131. Herein, the voltage levels of the first power source voltage VPP1 and the second power source voltage VPP2 may be the same or different. In addition, the first power source voltage VPP1 and the second power source voltage VPP2 are voltages for programming an OTP memory cell. The first power source voltage VPP1 is an internal power source voltage generated inside a display driving device, including the power source switching circuit 100. The second power source voltage VPP2 is an external power source voltage supplied from outside the display driving device. Thus, the OTP memory cell may be programmed by selecting the internal power source voltage VPP1 or the external power source voltage VPP2.

As illustrated in FIG. 1, a first MOSFET and a second MOSFET of a first type are connected in series to the first power source voltage terminal 121 of the first switching unit 120. In one or more examples, the first MOSFET and the second MOSFET of the first type are PMOS devices and will hereinafter be referred to as a first PMOS 122 and a second PMOS 123, respectively.

Regarding the first PMOS 122, a source terminal is connected to the first power source voltage terminal 121; a drain terminal is connected to a drain terminal of the second PMOS 123; and a gate terminal is connected to a first level shifter 126. The first level shifter 126 is configured to receive the first power source voltage VPP1.

Regarding the second PMOS 123, a drain terminal is connected to the drain terminal of the first PMOS 122; a source terminal is connected to the OTP memory 140; and a gate terminal is connected to a second level shifter 127. The second level shifter 127 is configured to receive the second power source voltage VPP2.

A third MOSFET of a second type is connected to the gate terminal of the second PMOS 123. In one or more examples, the third MOSFET of the second type is an NMOS device, and will hereinafter be referred to as third NMOS 124. Regarding the third NMOS 124, a drain terminal is connected to the gate terminal of the second PMOS 123; a source terminal is grounded; and a gate terminal of the third NMOS 124 is connected to a third level shifter 128. The third level shifter 128 is configured to receive the rated voltage VCI.

Body terminals of the first PMOS 122, second PMOS 123, and third NMOS 124 are connected to their respective source terminals to form a body diode.

The first level shifter 126, the second level shifter 127, and the third level shifter 128 operate according to a first control signal VPP_EN.

As illustrated in FIG. 1, a fourth MOSFET and a fifth MOSFET of the first type are connected in series to the second power source voltage terminal 131 of the second switching unit 130. In one or more examples, the fourth and fifth MOSFETs are PMOS devices that may be referred to as fourth PMOS 132 and fifth PMOS 133, respectively.

Regarding the fourth PMOS 132, a source terminal of the fourth PMOS 132 is connected to the second power source voltage terminal 131; a drain terminal is connected to a drain terminal of the fifth PMOS 133; and a gate terminal is connected to a fourth level shifter 136. The fourth level shifter 136 may be configured to receive the second power source voltage VPP2.

Regarding the fifth PMOS 133, the drain terminal of the fifth PMOS 133 is connected to a drain terminal of the fourth PMOS 132; a source terminal is connected to the OTP memory 140; and a gate terminal is connected to a fifth level shifter 137. The fifth level shifter 137 may be configured to receive the first power source voltage VPP1.

A sixth MOSFET of the second type is connected to the gate terminal of the fifth PMOS 133. In one or more examples, the sixth MOSFET of the second type is an NMOS device that will be referred to as the sixth NMOS 134. Regarding the sixth NMOS 134, a drain terminal of the sixth NMOS 134 is connected to the gate terminal of the fifth PMOS 133; a source terminal is grounded; and a gate terminal is connected to a sixth level shifter 138. The sixth level shifter 138 is connected to the rated voltage VCI and operates by the rated voltage VCI.

Body terminals of the fourth PMOS 132, fifth PMOS 133, and sixth NMOS 134 are connected to their respective source terminals to form a body diode.

The fourth level shifter 136, the fifth level shifter 137, and the sixth level shifter 138 operate according to the second control signal VPP_ENB.

In this way, the first switching unit 120 further includes the third NMOS 124 and the third level shifter 128. A memory cell of the OTP memory 140 may be programmed with the first power source voltage VPP1 by turning on the second PMOS 123 using the third NMOS 124 and the third level shifter 128. Also, the second switching unit 130 further includes the sixth NMOS 134 and the sixth level shifter 138. The memory cell of the OTP memory 140 may be programmed with the second power source voltage VPP2 by turning on the fifth PMOS 133 using the sixth NMOS 134 and the sixth level shifter 138. When programming the memory cells with the first power source voltage VPP1 and the second power source voltage VPP2, a leakage current that may flow in a direction from the first power source voltage terminal 121 to the second power source voltage terminal 131 and a leakage current that may flow in a direction from the second power source voltage terminal 131 to the first power source voltage terminal 121 may be blocked.

Next, the operation of the power source switching circuit will be described. The power source switching circuit 100 programs the OTP memory 140 by selecting either the first power source voltage VPP1 or the second power source voltage VPP2 by a user.

First, it is a case where a memory cell of the OTP memory 140 is programmed using the first power source voltage VPP1. At this time, the second power source voltage VPP2 may be in a floating state or a ground voltage VSSA may be applied thereto. The control IC 110 may control the first power source voltage VPP1 with a predetermined voltage to be applied to the first switching unit 120.

The first power source voltage VPP1 is applied through the first power source voltage terminal 121 according to the control operation of the control IC 110, and further, the first control signal VPP_EN is output. If the first control signal VPP_EN at a logic high level is applied, the first level shifter 126 supplied with the first power source voltage VPP1 operates normally and outputs a logic low-level voltage. The first PMOS 122 is turned on by the output of the first level shifter 126. On the other hand, since the second power source voltage VPP2 is in a floating state or a ground voltage is applied thereto, the second level shifter 127 operating with the second power source voltage VPP2 does not operate normally. Then, the second PMOS 123 may be unstable in the floating state.

In one or more examples, the third level shifter 128 receiving the rated voltage VCI according to the control IC 110 operates normally and outputs a logic high level voltage. Therefore, a third N MOS 124 is turned on with the output of the third level shifter 128. Then, the gate terminal of the second PMOS 123 becomes the ground voltage VSSA level, and the second PMOS 123 is turned on. Accordingly, the first power source voltage VPP1 is applied to the OTP memory 140 through the first PMOS 122 and the second PMOS 123, and the memory cell of the OTP memory 140 is programmed with the first power source voltage VPP1.

Meanwhile, when the OTP memory cell is programmed with the first power source voltage VPP1, the fifth PMOS 133 of the second switching unit 130 may be in a turned-off state. This is because leakage current may occur through a path from the first power source voltage terminal 121 to the second power source voltage terminal 131 if the fifth PMOS 133 is in a turned-on state. In order to block the flow of leakage current, the fifth PMOS 133 may be turned off.

According to the configuration of FIG. 1, the fifth PMOS 133 is connected to the fifth level shifter 137 operating with the first power source voltage VPP1. The fifth level shifter 137 turns off the fifth PMOS 133 using the second control signal VPP_ENB whose level is opposite to the level of the first control signal VPP_EN. The fifth level shifter 137 receives the low-level second control signal VPP_ENB and outputs a high-level voltage. Therefore, the fifth PMOS 133 is turned off. Since the fifth PMOS 133 is in a turned-off state, leakage current flowing in the direction of the second power source voltage terminal 131 may be blocked.

In this way, when the OTP memory cell is programmed with the first power source voltage VPP1, the first power source voltage VPP1 may be stably output to the OTP memory 140 through the first PMOS 122 and the second PMOS 123, and further, the flow of leakage current in the direction from the first power source voltage terminal 121 to the second power source voltage terminal 131 may be blocked by turning off the fifth PMOS 133.

According to one or more examples, even if a voltage higher or lower than the first power source voltage VPP1 is applied to the second power source VPP2, the memory cell of the OTP memory 140 may be programmed with the first power source voltage VPP1.

According to the control operation of the control IC 110, the first power source voltage VPP1 is applied through the first power source voltage terminal 121, and further, the first control signal VPP_EN is output. If the first control signal VPP_EN at a logic high level is applied, the first level shifter 126 applied with the first power source voltage VPP1 operates normally and outputs a low-level voltage. The first PMOS 122 is turned on with the output of the first level shifter 126. Also, the second power source voltage VPP2 higher or lower than the first power source voltage VPP1 is applied to the second level shifter 127, and operates normally. Therefore, since the second level shifter 127 is applied with the logic high level first control signal VPP_EN, the second level shifter 127 operating with the second power source voltage VPP2 outputs a low-level voltage, and the second PMOS 123 is turned on with the output of the second level shifter 127.

According to one or more examples, the third level shifter 128 supplied with the rated voltage VCI according to the control IC 110 operates normally and outputs a logic high-level voltage. Thus, the third NMOS 124 is turned on with the output of the third level shifter 128. Meanwhile, the gate terminal of the second PMOS 123 is turned on with the output voltage of the second level shifter 127. Accordingly, the first power source voltage VPP1 is applied to the OTP memory 140 through the first PMOS 122 and the second PMOS 123, and the OTP memory cell is programmed with the first power source voltage VPP1.

In addition, the fifth PMOS 133 is connected to the fifth level shifter 137 and may be configured to operate with the first power source voltage VPP1. The fifth level shifter 137 receives the second control signal VPP_ENB at logic low level and outputs a high-level voltage. Accordingly, the fifth PMOS 133 is turned off. Since the fifth PMOS 133 is in a turned-off state, leakage current flowing in the direction of the second power source voltage terminal 131 may be blocked.

In this way, when the OTP memory cell is programmed with the first power source voltage VPP1, the first power source voltage VPP1 may be stably output to the OTP memory 140 through the first PMOS 122 and the second PMOS 123, and further, even if a voltage higher or lower than the first power source voltage VPP1 is applied to the second power source voltage VPP2, leakage current flowing in the direction from the first power source voltage terminal 121 to the second power source voltage terminal 131 may be blocked by turning off the fifth PMOS 133.

Second, it is a case where the memory cell of the OTP memory 140 is programmed using the second power source voltage VPP2. At this time, the first power source voltage VPP1 may be in a floating state or a ground voltage VSSA may be applied thereto. The control IC 110 may control the second power source voltage VPP2 with a predetermined voltage to be applied to the second switching unit 130.

According to the control operation of the control IC 110, the second power source voltage VPP2 is applied through the second power source voltage terminal 131, and further, the logic high-level second control signal VPP_ENB is output. If the second control signal VPP_ENB is applied, the fourth level shifter 136 supplied with the second power source voltage VPP2 operates normally and outputs a low-level voltage. The fourth PMOS 132 is turned on with the output of the fourth level shifter 136. On the other hand, since the first power source voltage VPP1 is in a floating state or a ground voltage is applied thereto, the fifth level shifter 137 operating with the first power source voltage VPP1 does not operate normally. Then, the fifth PMOS 133 may be in an unstable state as a floating state.

According to one or more examples, the sixth level shifter 138 supplied with the rated voltage VCI according to the control IC 100 operates normally and outputs a high-level voltage. After that, the sixth NMOS 134 is turned on with the output of the sixth level shifter 138. Then, a gate terminal of the fifth PMOS 133 becomes the level of the ground voltage VSSA, and the fifth PMOS 133 is turned on. Thus, the second power source voltage VPP2 is applied to the OTP memory 140 through the fourth PMOS 132 and the fifth PMOS 133, and the memory cell of the OTP memory 140 is programmed with the second power source voltage VPP2.

Meanwhile, when the OTP memory cell is programmed with the second power source voltage VPP2, the second PMOS of the first switching unit 120 should be in the OFF state. This is because leakage current may occur through a path from the second power source voltage terminal 131 to the first power source voltage terminal 121 if the second PMOS 123 is in an ON state. In order to block the flow of the leakage current, the second PMOS 123 only needs to be in a turned-off state.

According to the configuration of FIG. 1, the second PMOS 123 is connected to the second level shifter 127 and may be configured to operate with the second power source voltage VPP2. The second level shifter 127 receives the low-level first control signal VPP_EN and outputs a high-level voltage to turn off the second PMOS 123. Since the second PMOS 123 is in a turned-off state, leakage current flowing in the direction of the first power source voltage terminal 121 may be blocked.

In this way, even when the OTP memory cell is programmed with the second power source voltage VPP2, the second power source voltage VPP2 is stably output to the OTP memory 140 through the fourth PMOS 132 and the fifth PMOS 133, and further, the flow of the leakage current from the second power source voltage terminal 131 to the first power source voltage terminal 121 may be blocked by turning off the second PMOS 123.

According to one or more examples, even if the first power source voltage VPP1, higher or lower than the second power source voltage VPP2, is applied to the first power source voltage terminal 121, the memory cell of the OTP memory 140 may be programmed with the second power source voltage VPP2.

According to the control operation of the control IC 110, the second power source voltage VPP2 is applied through the second power source voltage terminal 131, and a high-level second control signal VPP_ENB is output. If the second control signal VPP_ENB is applied, the fourth level shifter 136 applied with the second power source voltage VPP2 operates normally and outputs a low-level voltage. The fourth PMOS 132 is turned on with the output of the fourth level shifter 136. In addition, since the first power source voltage VPP1, higher or lower than the second power source voltage VPP2, is applied to the fifth level shifter 137, the fifth level shifter 137 operates with the first power source voltage VPP1 operating normally. Therefore, the fifth level shifter 137 is supplied with the high-level second control signal VPP_ENB to output a low-level voltage, and the fifth PMOS 133 is turned on.

According to one or more examples, the sixth level shifter 138 supplied with the rated voltage VCI according to the control IC 110 operates normally, and the sixth level shifter 138 outputs a high-level voltage. The sixth NMOS 134 is turned on with the output of the sixth level shifter 138. Meanwhile, the gate terminal of the fifth PMOS 133 is turned on by the fifth level shifter 137. Thus, the second power source voltage VPP2 is applied to the OTP memory 140 through the fourth PMOS 132 and the fifth PMOS 133, and the OTP memory cell is programmed with the second power source voltage VPP2.

In addition, the second PMOS 123 is connected to the second level shifter 127 operating with the second power source voltage VPP2. Thus, the second level shifter 127 operates normally. The second level shifter 127 outputs a high-level voltage using the low-level first control signal VPP_EN and turns off the second PMOS 123. Since the second PMOS 123 is in a turned-off state, leakage current flowing in the direction of the first power source voltage terminal 121 may be blocked.

In this way, when the OTP memory cell is programmed with the second power source voltage VPP2, the second power source voltage VPP2 may be stably output to the OTP memory 140 through the fourth PMOS 132 and the fifth PMOS 133. Additionally, even if the first power source voltage VPP1, higher or lower than the second power source voltage VPP2, is applied to the first power source voltage terminal 121, the flow of leakage current in the direction from the second power source voltage terminal 131 to the first power source voltage terminal 121 may be blocked by turning off the second PMOS 123.

Figure 2:
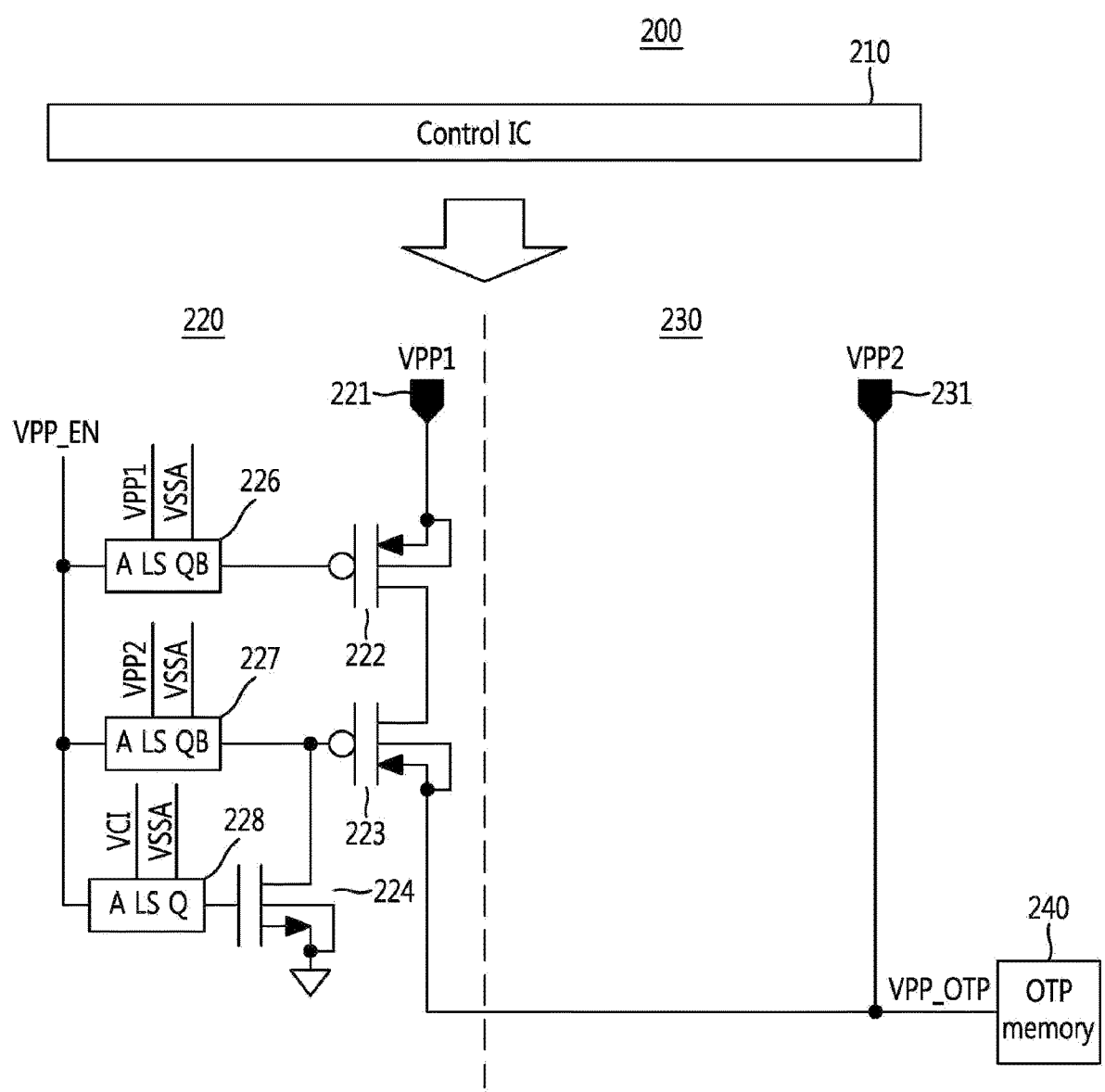
FIG. 2 illustrates an exemplary power source switching circuit in accordance with a second embodiment of one or more examples.

FIG. 2 illustrates a block diagram of an exemplary power source switching circuit in accordance with a second embodiment of one or more examples of the present disclosure.

According to FIG. 2, a power source switching circuit 200 includes a control IC 210, a first switching unit 220, a second switching unit 230, and a non-volatile memory 240.

The configuration illustrated in FIG. 2 is similar to the configuration of the first embodiment described above and will hereinafter focus on different configurations.

Compared to the configuration of the first embodiment, the first switching unit 220 includes level shifters and a switching device, and no circuits are connected to a second power source voltage terminal 231 of the second switching unit 230.

Specifically, a first MOSFET and a second MOSFET of the first type are connected in series to a first power source voltage terminal 221 of the first switching unit 220. In one or more examples, the first MOSFET and second MOSFET of the first type are PMOS devices and will hereinafter be referred to as first PMOS 222 and second PMOS 223. Regarding the first PMOS 222, a source terminal is connected to the first power source voltage terminal 221; a drain terminal is connected to a drain terminal of the second PMOS 223; and a gate terminal is connected to a first level shifter 226. The first level shifter 226 may be configured to receive a first power source voltage VPP1.

Regarding the second PMOS 223, the drain terminal is connected to the drain terminal of the first PMOS 222; a source terminal is connected to the OTP memory 240; and a gate terminal is connected to a second level shifter 227. The second level shifter 227 may be configured to receive a second power source voltage VPP2.

A third MOSFET of a second type is connected to the gate terminal of the second PMOS 223. In one or more examples, the third MOSFET of the second type is an NMOS device and will hereinafter be referred to as third NMOS 224. Regarding the third NMOS 224, a drain terminal is connected to the gate terminal of the second PMOS 223; a source terminal is grounded; and the gate terminal is connected to a third level shifter 228. The third level shifter 228 operates by receiving a rated voltage VCI.

Body terminals of the first PMOS 222, second PMOS 223, and third NMOS 224 are connected to their respective source terminals to form a body diode.

The first level shifter 226, the second level shifter 227, and third level shifter 228 operate according to a first control signal VPP_EN. As described above, the first and second power source voltages VPP1, VPP2 are voltages for programming the OTP memory cell, and the rated voltage VCI may be a driving voltage of the control IC 210.

The power source switching circuit, in accordance with the second embodiment of this configuration, operates as described in the following description.

First, it is a case where a memory cell of the OTP memory 240 is programmed using the first power source voltage VPP1. At this time, the power source switching circuit 200, in accordance with the second embodiment, may be applied when the second power source voltage terminal 231 is in a floating state. In other words, when the OTP memory cell is programmed using the first power source voltage VPP1 supplied through the first power source voltage terminal 221, the second power source voltage terminal 231 should float in order to prevent a current from being leaked to the second power source voltage terminal 231.

The first power source voltage VPP1 is applied through the first power source voltage terminal 221 according to the control operation of the control IC 210, and further, a high-level first control signal VPP_EN is output. If the first control signal VPP_EN is applied, the first level shifter 226 supplied with the first power source voltage VPP1 operates normally and outputs a low-level voltage. The first PMOS 222 is turned on with the output of the first level shifter 226. On the other hand, since the second power source voltage VPP2 is not applied, the second level shifter 227 operating with the second power source voltage VPP2 does not operate normally. Therefore, the second PMOS 223 may be unstable as a floating state.

However, the third level shifter 228 supplied with the rated voltage VCI according to the control IC 210 operates normally, and thus, the third level shifter 228 outputs a high-level voltage. The third NMOS 224 is turned on with the output of the third level shifter 228. Then, the gate terminal of the second PMOS 223 becomes the level of a ground voltage VSSA, and the second PMOS 223 is turned on. Therefore, the first power source voltage VPP1 is applied to the OTP memory 240 through the first PMOS 222 and the second PMOS 223, and the OTP memory cell is programmed with the first power source voltage VPP1.

At this time, since the second power source voltage terminal 231 is in a floating state, it becomes the level of the first power source voltage VPP1. Therefore, the flow of leakage current from the first power source voltage terminal 221 to the second power source voltage terminal 231 may be blocked.

Second, it is a case where a memory cell of the OTP memory 240 is programmed using the second power source voltage VPP2. At this time, the first power source voltage VPP1 of the power source switching circuit 200, in accordance with the second embodiment, may be in a floating state or the ground voltage VSSA may be applied thereto. The control IC 210 controls such that the second power source voltage VPP2 with a predetermined voltage is applied to the second switching unit 230.

The second power source voltage VPP2 is applied to the OTP memory 240 according to the control operation of the control IC 210 through the second power source voltage terminal 231, and further, the logic low-level first control signal VPP_EN is output. Since the first power source voltage VPP1 is in a floating state or a ground voltage is applied thereto, the first level shifter 226 operating with the first power source VPP1 does not operate normally. Therefore, the first PMOS 222 may be unstable as a floating state.

On the other hand, the second level shifter 227 receives the logic low-level first control signal VPP_EN and the second power source voltage VPP2 according to the control operation of the control IC 210 and outputs a high-level voltage. Thus, the second PMOS 223 is turned off. Then, the leakage current flowing from the second power source voltage terminal 231 to the first power source voltage terminal 221 may be blocked. Also, the third level shifter 228, operating with the rated voltage VCI, receives the low-level first control signal VPP_EN and outputs a low-level voltage. Thus, the third NMOS 224 is also turned off.

In this way, when the OTP memory cell is programmed with the second power source voltage VPP2, the second power source voltage VPP2 may be stably output to the OTP memory 240 through the second power source voltage terminal 231, and even if the first power source voltage terminal 221 is in a floating state or the ground voltage VSSA is applied thereto, the flow of leakage current from the second power source voltage terminal 231 to the first power source voltage terminal 221 may be blocked by turning off the second PMOS 223.

According to one or more examples, even if the first power source voltage VPP1, higher or lower than the second power source voltage VPP2, is applied to the first power source voltage terminal 221, the memory cell of the OTP memory 240 may be programmed with the second power source voltage VPP2.

The second power source voltage VPP2 is applied according to the control operation of the control IC 210 through the second power source voltage terminal 231, and further, the low-level first control signal VPP_EN is output. If the first control signal VPP_EN is applied, the first level shifter 226, receiving the first power source voltage VPP1, operates normally and outputs a high-level voltage. The first PMOS 222 is turned off with the output of the first level shifter 226. Similarly, if the first control signal VPP_EN is applied, the second level shifter 227, receiving the second power source voltage VPP2, operates normally and outputs a high-level voltage. The second PMOS 223 is turned off with the output of the second level shifter 227. Also, the third level shifter 228, operating with the rated voltage VCI, receives the low-level first control signal VPP_EN and outputs a low-level voltage. Therefore, the third NMOS 224 is also turned off.

In this way, when the OTP memory cell is programmed with the second power source voltage VPP2, the second power source voltage VPP2 may be stably output to the OTP memory 240 through the second power source voltage terminal 231. Additionally, even if the first power source voltage VPP1, higher or lower than the second power source voltage VPP2, is applied to the first power source voltage terminal 221, the flow of leakage current from the second power source voltage terminal 231 to the first power source voltage 221 may be blocked by turning off the first PMOS 222 and second PMOS 223.

Figure 3:
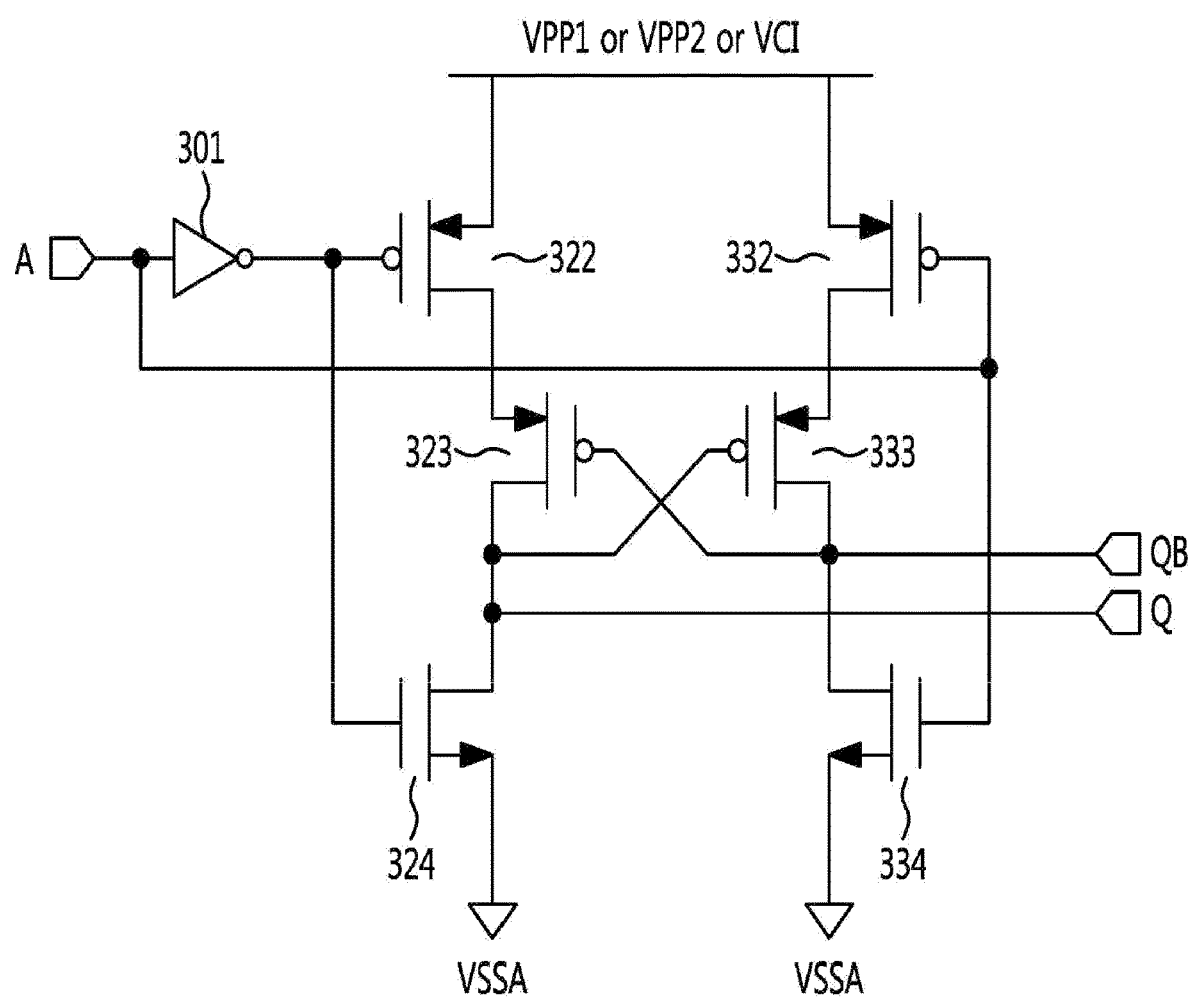
FIG. 3 illustrates an exemplary level shifter circuit of a block diagram in accordance with one or more examples.

FIG. 3 illustrates configurations of the first through sixth level shifters shown in FIGS. 1 and 2. The configurations of the first through sixth level shifters are the same, and voltages at different levels may be output based on the inputted first and second control signals VPP_EN, VPP_ENB and power source voltage VPP. The power source voltage VPP may be one of the first power source voltage VPP1, second power source voltages VPP2, or rated voltage VCI.

The level shifter of FIG. 3 may be formed of a first inverter 301 and seventh through twelfth MOSFETs. Among them, the seventh MOSFET 322, the eighth MOSFET 332, the ninth MOSFET 323, and the tenth MOSFET 333 may be formed of PMOS devices. Hereinafter, they will be referred to as seventh PMOS 322, eighth PMOS 332, ninth PMOS 323, and tenth PMOS 333. On the other hand, the eleventh MOSFET 324 and twelfth MOSFET 334 may be formed of NMOS devices. Hereinafter, they will be referred to as the eleventh NMOS 324 and twelfth NMOS 334. A non-inverting terminal Q of the level shifter may be connected between a drain terminal of the ninth PMOS 323 and a drain terminal of the eleventh NMOS 324. Also, an inverting terminal QB of the level shifter may be connected between a drain terminal of the tenth PMOS 333 and a drain terminal of the twelfth NMOS 334.

The level shifter of FIG. 3 receives a first control signal VPP_EN or a second control signal VPP_ENB through an input terminal (terminal A) of the inverter 301. Also, the level shifter receives the first power source voltage VPP1, second power source voltage VPP2, or rated voltage VCI through source voltages of the seventh MOS 322 or eighth MOS 332. The output of the non-inverting terminal Q or the inverting terminal QB of the level shifter changes according to the level of a control signal or a voltage applied to the source terminals of the seventh MOS 322 and the eighth MOS 332.

According to the present description, there may be an effect in which a power source voltage for programming an OTP memory cell is stably output without leakage current even if any one of a plurality of power source voltages is used.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure

What is claimed is:

1. A power source switching circuit for a memory device, comprising:
   a first power source voltage terminal and a second power source voltage terminal;
   a first metal-oxide-semiconductor field-effect transistor (MOSFET) and a second MOSFET connected in series with the first power source voltage terminal;
   a first level shifter connected to the first MOSFET and supplied with a first power source voltage;
   a second level shifter connected to the second MOSFET and supplied with a second power source voltage;
   a third MOSFET connected to the second MOSFET;
   a third level shifter connected to the third MOSFET and supplied with a third power source voltage;
   a fourth MOSFET and a fifth MOSFET connected in series with the second power source voltage terminal;
   a fourth level shifter connected to the fourth MOSFET and supplied with the second power source voltage;
   a fifth level shifter connected to the fifth MOSFET and supplied with the first power source voltage;
   a sixth MOSFET connected to the fifth MOSFET; and
   a sixth level shifter connected to the sixth MOSFET and supplied with the third power source voltage,
   wherein a memory cell of a non-volatile memory connected to the second and fifth MOSFETs is programmed using the first power source voltage or the second power source voltage.

2. The power source switching circuit of claim 1, wherein, when the first power source voltage is supplied as a programming voltage for the non-volatile memory, a gate terminal of the second MOSFET becomes a ground voltage level by the third level shifter using the third power source voltage, and the first power source voltage is output to the non-volatile memory through the first MOSFET and the second MOSFET in a turn-on state.

3. The power source switching circuit of claim 2, wherein the second power source voltage terminal is supplied with a ground voltage or a predetermined voltage or is in a floating state, and the fifth MOSFET is turned off.

4. The power source switching circuit of claim 3, wherein a first control signal applied to the first through third level shifters is in a high level state, and a second control signal applied to the fourth through sixth level shifters is in a low level state.

5. The power source switching circuit of claim 1, wherein, when the second power source voltage is supplied as a programming voltage for the non-volatile memory, a gate terminal of the fifth MOSFET becomes a ground voltage level by the sixth level shifter using the third power source voltage, and the second power source voltage is output to the non-volatile memory through the fourth MOSFET and the fifth MOSFET in a turn-on state.

6. The power source switching circuit of claim 5, wherein the first power source voltage terminal is supplied with a ground voltage or a predetermined voltage or is in a floating state, and the second MOSFET is turned off.

7. The power source switching circuit of claim 6, wherein a first control signal applied to the first through third level shifters is in a low level state, and a second control signal applied to the fourth through sixth level shifters is in a high level state.

8. The power source switching circuit of claim 1, wherein the first, second, fourth, and fifth MOSFETs are P-channel metal-oxide semiconductors (PMOSs), and the third and sixth MOSFETs are N-channel metal-oxide semiconductors (NMOSs).

9. The power source switching circuit of claim 8, wherein a drain terminal of the first MOSFET and a drain terminal of the second MOSFET are connected to each other,
wherein a drain terminal of the fourth MOSFET and a drain terminal of the fifth MOSFET are connected to each other,
wherein a drain terminal of the third MOSFET is connected to a gate terminal of the second MOSFET, and
wherein a drain terminal of the sixth MOSFET is connected to a gate terminal of the fifth MOSFET.

10. The power source switching circuit of claim 9, wherein body terminals of the first through sixth MOSFETs are connected to their respective source terminals.

11. The power source switching circuit of claim 1, wherein voltage levels of the first through third power source voltages are different from each other.

12. A power source switching circuit for a memory device, comprising:
a first power source voltage terminal for supplying a first power source voltage;
a second power source voltage terminal for supplying a second power source voltage;
a first metal-oxide-semiconductor field-effect transistor (MOSFET) and a second MOSFET connected in series with the first power source voltage terminal;
a first level shifter connected to the first MOSFET and supplied with the first power source voltage;
a second level shifter connected to the second MOSFET and supplied with the second power source voltage;
a third MOSFET connected to the second MOSFET; and
a third level shifter connected to the third MOSFET and supplied with a third power source voltage,
wherein a memory cell of a non-volatile memory is programmed using the first power source voltage or the second power source voltage, and
wherein the first and second MOSFETs are P-channel metal-oxide semiconductors (PMOSs) and the third MOSFET is an N-channel metal-oxide semiconductor (NMOS).

13. The power source switching circuit of claim 12, wherein, when the first power source voltage is supplied as a programming voltage for the non-volatile memory, a gate terminal of the second MOSFET becomes a ground voltage level by the third level shifter using the third power source voltage, and the first power source voltage is output to the non-volatile memory through the first and second MOSFETs in a turn-on state.

14. The power source switching circuit of claim 13, wherein the second power source voltage terminal is in a floating state.

15. The power source switching circuit of claim 14, wherein a first control signal applied to the first through third level shifters is in a high level state.

16. The power source switching circuit of claim 12, wherein, when the second power source voltage is supplied as a programming voltage for the non-volatile memory, the first power source voltage terminal is supplied with a ground voltage or a predetermined voltage or is in a floating state, and the second MOSFET is turned off.

17. The power source switching circuit of claim 16, wherein a first control signal applied to the first through third level shifters is in a low level state.

18. The power source switching circuit of claim 12, wherein a drain terminal of the first MOSFET and a drain terminal of the second MOSFET are connected to each other, and a drain terminal of the third MOSFET is connected to a gate terminal of the second MOSFET.

19. The power source switching circuit of claim 18, wherein body terminals of the first through third MOSFETs are connected to their respective source terminals.

* * * * *